(12) United States Patent
Moyer (10) Patent No.: US 6,414,512 B1
(45) Date of Patent: Jul. 2, 2002

(54) ON-CHIP TERMINATION CIRCUIT

(75) Inventor: Todd K. Moyer, Aurora, OR (US)

(73) Assignee: Pixelworks, Inc., Tualatin, OR (US)

( * ) Notice: Subject to any disclaimer, the term of this patent is extended or adjusted under 35 U.S.C. 154(b) by 0 days.

(21) Appl. No.: 09/686,351

(22) Filed: Oct. 10, 2000

Related U.S. Application Data (60) Provisional application No. 60/194,674, filed on Apr. 4, 2000.

(51) Int. Cl.[7] ............................................... H03K 17/16
(52) U.S. Cl. .......................................... 326/30; 326/86
(58) Field of Search ................................ 326/30, 82, 83, 326/86, 90

(56) References Cited

U.S. PATENT DOCUMENTS

| | | | |
|---|---|---|---|
| 4,450,370 A | | 5/1984 | Davis |
| 5,581,197 A | * | 12/1996 | Motley et al. ................. 326/30 |
| 6,201,405 B1 | * | 3/2001 | Hedberg ...................... 326/30 |
| 6,288,564 B1 | * | 9/2001 | Hedberg ...................... 326/30 |

FOREIGN PATENT DOCUMENTS

| | | | |
|---|---|---|---|
| DE | 19735982 A1 | * | 3/1999 |
| EP | WO 99/09728 | * | 2/1999 |

OTHER PUBLICATIONS

Digital Display Working Group's Digital Visual Interface standard, revision 1.0, published Apr. 2, 1999.

* cited by examiner

Primary Examiner—Daniel D. Chang
(74) Attorney, Agent, or Firm—Marger Johnson & McCollom (57) ABSTRACT

The present invention is an on-chip termination circuit designed to address resistance variability by making a portion of a termination resistance a MOSFET transistor operating in the triode region and replicating the termination resistance inside of a feedback loop to control the resistance of the termination resistance through the replication resistance. The MOSFET transistor's non-linear operation is mitigated by the addition of a linear resistor in series with the MOSFET transistor. By doing so, a substantial portion of the voltage across the composite termination resistance is across the linear termination resistor thereby significantly reducing the non-linear effects of the MOSFET transistor. The on-chip termination circuit includes a termination resistance, a replication resistance coupled to the termination resistance and adapted to replicate the termination resistance, and a feedback circuit adapted to maintain substantially constant a reference voltage across the replication resistance. The termination circuit further includes a voltage reference circuit adapted to generate a reference voltage and a reference current.

24 Claims, 5 Drawing Sheets

ON-CHIP TERMINATION CIRCUIT

This application claims priority from U.S. Provisional Application No. 60/194,674, filed Apr. 4, 2000, which is incorporated herein by reference.

BACKGROUND OF THE INVENTION

1. Field of the Invention

This invention relates to transmission of digital image data sent from a computing device to a display device and, more particularly, to an on-chip termination circuit for terminating a line transmitting the digital image data from the computing device to the display device for eventual visual display.

2. Description of the Prior Art

A personal computing device transmits digital image data to an attached display device through a transmission line for eventual visual display. An ideal transmission line will deliver the image data signal to the display without any loss or corruption. Practical transmission lines, however, are not ideal.

To minimize distortion of the transmitted digital data, the transmission line requires proper transmission line termination. If the transmission line is not terminated with its characteristic impedance, the input impedance may become complex and exhibit inductive or capacitive characteristics depending on the nature of the load, its electrical distance from the source, or the measure of termination resistance.

If a mismatch occurs between the line's characteristic impedance and the termination resistance as the image data signal travels down the transmission line, a portion of the image data signal is reflected toward the computing device. The reflected wave combines with the forward wave and alters it according to its relative phase and amplitude, corrupting the image data. To avoid impedance mismatches, transmission lines must be terminated commonly with precise termination resistances having tight tolerances typically around 5% or better.

Transmission line termination is typically achieved through fixed, discrete, off-chip, precision resistors that accurately match the transmission line characteristic impedance. Off-chip precision resistors having tight tolerances are readily available. But they require significant circuit board space increasing circuit board layout complexity and cost.

Transmission line termination is particularly challenging when working with resistances built into semiconductor integrated circuits (on-chip). On-chip termination resistances are difficult to manufacture with tight tolerances. On-chip resistors typically show a variation as much as 15–20% or worse over process and temperature. Precision on-chip resistors are difficult to achieve with high volume semiconductor processing methods, for example, because of variations in sheet resistance and line width control. Furthermore, many applications use high-density digital Complementary Metal Oxide Semiconductor (CMOS) technology for high speed. As speed performance improves, process elements such as poly and moat resistors are often unavailable to circuit designers because of the use of silicide to minimize sheet resistances. Thus, to create resistors, additional mask levels, or the use of analog specific processes, are required.

Figure 1:
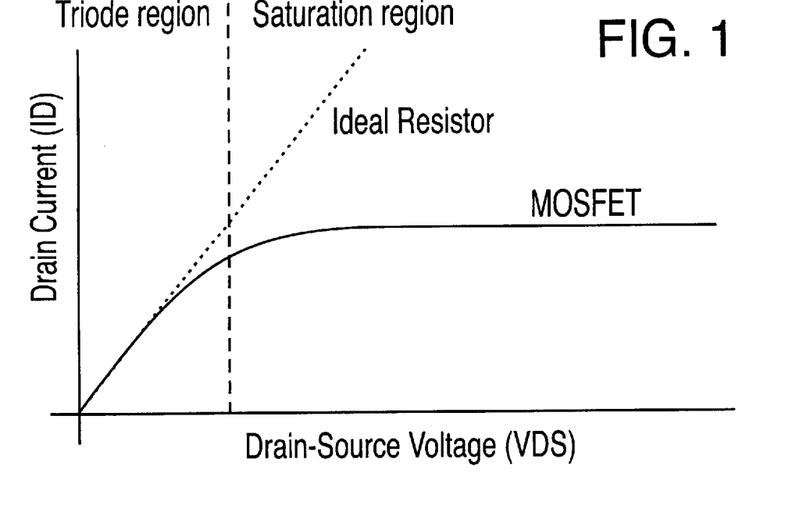
FIG. 1 is graph of the output characteristics of a MOSFET device.

An alternative technique for implementing termination resistors on a CMOS integrated circuit is to bias a Metal Oxide Semiconductor Field Effect Transistor (MOSFET) into the triode region. FIG. 1 is a typical output characteristic of a MOSFET device in which two regions of operation are shown: the triode region and the saturation region. A MOSFET device biased in the triode region operates similarly to an ideal resistor as shown in FIG. 1 where the drain current is approximately linearly proportional to the drain-source voltage. As the drain source voltage increases, however, the MOSFET device's resistance exhibits non-linearity with respect to drain-source voltage. This non-linearity results in operation that deviates from the ideal resistor. More specifically, the differential or small signal MOSFET resistance given by $dV_{DS}/dI_D$, changes as the voltage across the drain and source of the MOSFET changes. This change in differential resistance is large enough to be problematic in many applications, including image data transmission, where it can cause impedance mismatch resulting in bit errors.

Accordingly, a need remains for an inexpensive and effective on-chip termination circuit that prevents impedance mismatches in transmission line circuits by exhibiting superior linearity and tight manufacturing tolerances.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF THE PREFERRED EMBODIMENT

The following description of the preferred embodiment of the present invention refers to specific technical requirements of the Digital Display Working Group's (DDWG) Digital Visual Interface (DVI) standard, revision 1.0, published Apr. 2, 1999. The DVI is incorporated herein by reference. The termination circuit of the present invention, however, is not limited to the DVI application. Rather, the termination circuit of the present invention applies generally to transmission lines and twisted-pair transmission lines in particular.

Those of skill in the art will appreciate that the invented apparatus and method described and illustrated herein may be implemented in hardware, software, firmware, or any suitable combination thereof. Preferably, the apparatus and method are implemented in hardware integrated into a semiconductor device and, more particularly, are implemented integrated into a semiconductor digital display controller for purposes of driving a visual display inexpensively and flexibly. Those of skill in the art will appreciate that the apparatus and method of the present invention can be implemented in software or firmware by a computer or microprocessor process in which instructions are executed. The instructions are stored for execution on a computer-readable medium and executed by any suitable instruction processor. Alternative embodiments are contemplated, however, and are within the spirit and scope of the invention.

The present invention is designed to address resistance variability by making a portion of the termination resistance a MOSFET transistor operating in the triode region and replicating the termination resistance inside of a feedback loop to control the resistance of the termination resistance through the replication resistance. The MOSFET transistor's non-linear operation is mitigated by the addition of a linear resistor in series with the MOSFET transistor. By doing so, a substantial portion of the voltage across the composite termination resistance is across the linear termination resistor thereby significantly reducing the non-linear effects of the MOSFET transistor.

Figure 2:
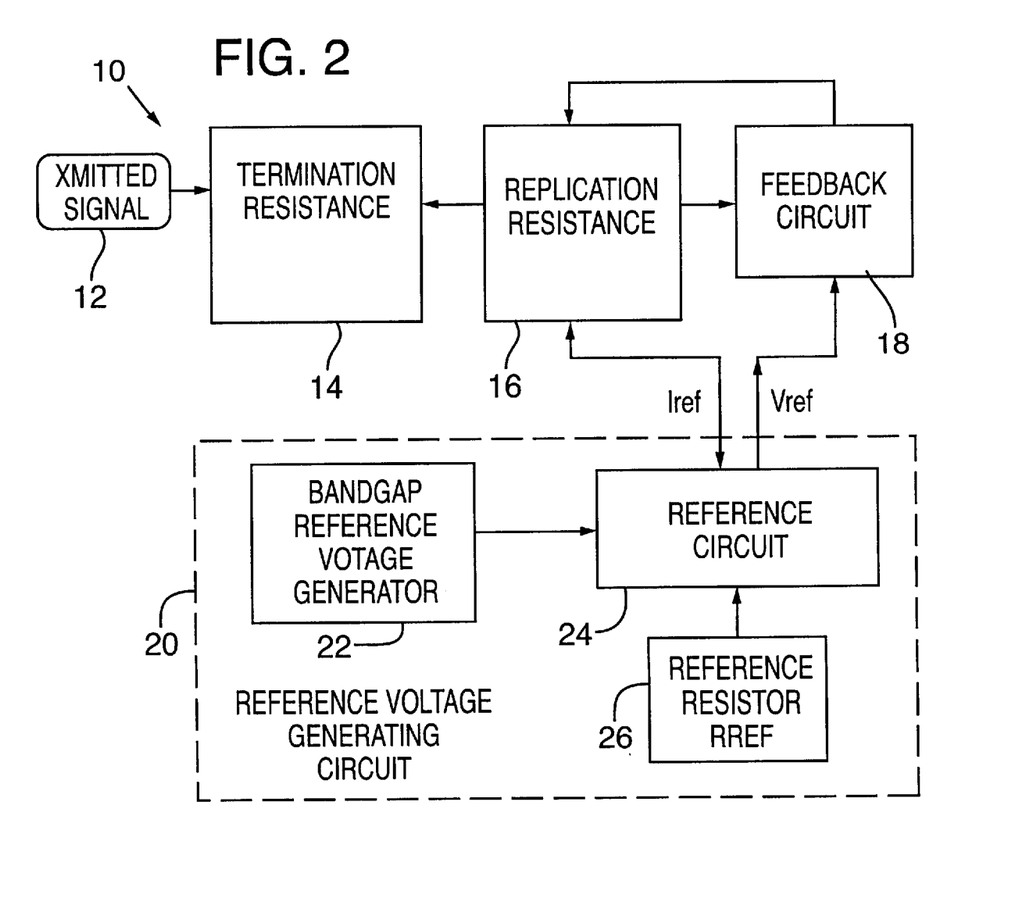
FIG. 2 is a block diagram of a termination circuit of the present invention.

Referring to FIG. 2, an image data signal 12 is transmitted through a twisted pair differential transmission line (not shown) from a computing device (not shown) to a termination circuit 10 included in a semiconductor display device controller (not shown) that is, in turn, included in a display device (not shown). A termination resistance 14 receives the image data signal 12 and is coupled to a replication resistance 16. The replication resistance 16 replicates or duplicates the termination resistance 14. A reference voltage generating circuit 20 generates a reference voltage $V_{REF}$ and a reference current $I_{REF}$. The reference voltage generating circuit 20 is coupled to the replication resistance 16 and the feedback circuit 18. The reference voltage generating circuit 20 includes a reference circuit 24 coupled to a bandgap reference voltage generator 22 and a reference resistor 26. The reference resistor 26 is preferably not integrated into the display device controller (not shown). That is, the reference resistor 26 is preferably off-chip so that an accurate enough resistance is easily achievable. The bandgap reference voltage generator 22 is preferably integrated into the display device controller (not shown) primarily because the termination circuit 10 is insensitive to the accuracy of the bandgap reference voltage $V_{BG}$ as is explained in more detail below. The reference current Iref flows through the replication resistance 16. A feedback circuit 18 receives the reference voltage $V_{REF}$ and maintains the reference voltage $V_{REF}$ across the replication resistance 16. Since the reference current $I_{REF}$ and the reference voltage $V_{REF}$ are maintained substantially constant due to the operation of the reference resistor 26 and the feedback circuit 18, nonlinear operation associated with the termination resistance 14 substantially disappears as described in more detail below.

Figure 3:
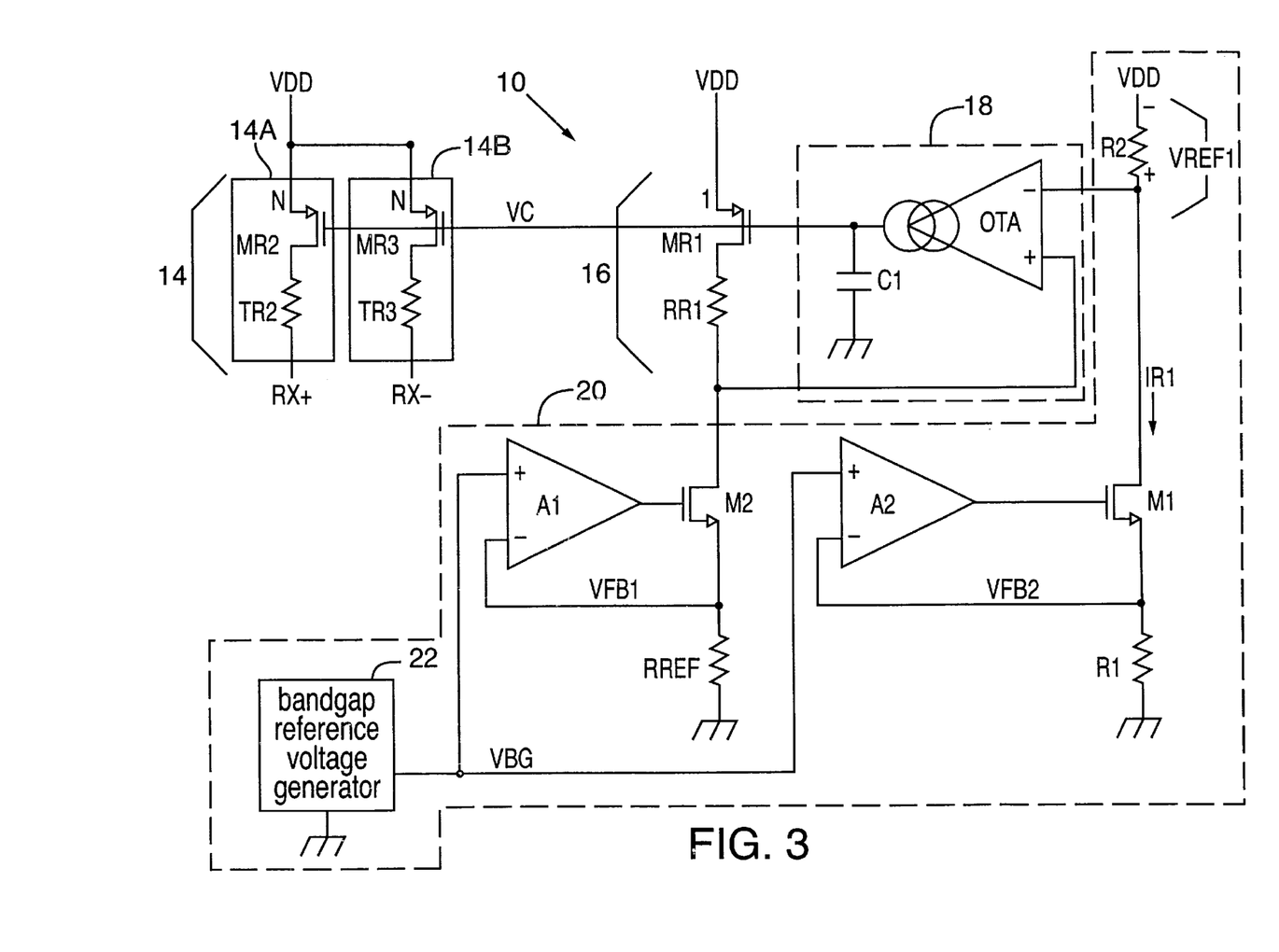
FIG. 3 is a schematic diagram of the termination circuit of the present invention.

FIG. 3 is a detailed schematic of the termination circuit 10 of the present invention. Referring to FIG. 3, the termination circuit 10 includes a termination resistance 14 for terminating each of the twisted pair transmission lines RX+ and RX- as required by the DVI standard. The transmission line RX+ is terminated with termination resistance 14A comprising MOSFET transistor MR2 serially connected to a termination resistance TR2. Likewise, the transmission line RX- is terminated with termination resistance 14B comprising MOSFET transistor MR3 serially connected to a termination resistance TR3. The MOSFET transistors MR2 and MR3 have corresponding gates, sources, and drains. The sources of transistors MR2 and MR3 are commonly connected to a power supply $V_{DD}$. The drain of MOSFET MR2 is connected to a first end of the resistor TR2 and the drain of MOSFET MR3 is connected to a first end of the resistor TR3. A second end of the resistor TR2 receives the image data signal 12 transmitted on the transmission line RX+. A second end of the resistor TR3 receives the image data signal 12 transmitted on the transmission line RX-.

The gates of transistors MR2 and MR3 are commonly connected to the replication resistance 16. The replication resistance 16, in turn, comprises a MOSFET transistor MR1 serially connected to a replication resistor RR1. The MOSFET transistor MR1 includes a gate commonly connected to the gates of transistors MR2 and MR3 and to the feedback circuit 18, a source connected to the power supply $V_{DD}$, and a drain connected to a first end of the replication resistor RR1.

The second end of the replication resistor RR1 is coupled to the reference voltage generating circuit 20. The reference voltage generating circuit 20 includes a bandgap voltage reference generator 22 adapted to generate a bandgap voltage $V_{BG}$ and supply the bandgap voltage $V_{BG}$ to a positive input of amplifiers A1 and A2. The amplifier A1 includes a negative input connected to a first end of the reference resistor $R_{REF}$ (block 26 in FIG. 2). The second end of the reference resistor $R_{REF}$ is connected to ground. The amplifier A1 includes an output connected to a gate of a MOSFET transistor M2. A source of the MOSFET transistor M2 is connected to the first end of the resistor $R_{REF}$.

The bandgap voltage reference generator 22 is preferably integrated into the semiconductor display device controller (not shown). The reference resistor $R_{REF}$ is external to the display device controller (not shown) or off-chip. The reference resistor $R_{REF}$ is preferably an inexpensive precision (e.g., 1 percent or better) metal film resistor. Both the bandgap reference voltage generator 22 and the reference resistor $R_{REF}$ are common in mixed signal integrated circuits and thus, do not add significant cost to the termination circuit 10.

The amplifier A2 includes a negative input connected to a first end of a resistor R1. The amplifier A2 includes an output connected to a gate of a MOSFET transistor M1. A source of the MOSFET transistor M1 is connected to the first end of a resistor R1. A second end of the resistor R1 is connected to ground. A drain of the MOSFET transistor M1 is connected to a first end of a resistor R2. A second end of the resistor R2 is connected to the power supply $V_{DD}$.

The feedback circuit 18 comprises an Operation Transconductance Amplifier (OTA) and a capacitor C1. The OTA has a negative input connected to the first end of the resistor R2 and the drain of the MOSFET transistor M1. An output of the OTA is connected to a first end of the capacitor C1 and to the gates of MOSFET transistors MR1, MR2, and MR3. The second end of the capacitor C1 is connected to ground. The positive input of the OTA is connected to the second end of the replication resistor RR1 to thereby form a feedback loop with the replica resistance 16 and the capacitor C1. The capacitor C1 is a compensation capacitor that ensures stability of the OTA's feedback loop.

The termination circuit 10 operates as follows. The bandgap reference voltage generator 22 provides the bandgap voltage $V_{BG}$ to the positive input of the amplifiers A1 and A2. The feedback loop of amplifier A1 forces the bandgap voltage $V_{BG}$ across the first end of the reference resistor $R_{REF}$ generating the reference current $I_{REF}$. The reference current $I_{REF}$ flows through the replica resistance 16 because substantially no current flows through the negative input of amplifier A1 or the gate of transistor M2 due to their correspondingly high input resistance. The reference current $I_{REF}$ is given by $V_{BG}/R_{REF}$.

The feedback loop of amplifier A2 forces the bandgap voltage $V_{BG}$ across the first end of resistor R1. The current $I_{R1}$ flows through the resistor R1 and through the resistor R2 because substantially no current flows through the negative input of amplifier A2, the gate of transistor M1, or the negative input of the OTA due to their correspondingly high input resistance. The current $I_{R1}$ is given by $V_{BG}/R1$. The reference voltage $V_{REF1}$ across the resistor R2 is given by $V_{REF1} = R*I_{R1}$. Since $I_{R1}=V_{BG}/R1$, then $V_{REF1}=R2/R1*V_{BG}$.

Note that in the above-described equation, the reference voltage is proportional to a ratio of resistors R2 and R1. Both of these resistors are constructed of identical material, e.g., non-salicide polysilicon, on a common monolithic integrated circuit (display device controller (not shown)). Therefore, the ratio of R2 to R1 is precisely known despite variations in absolute resistance due to temperature and process variations. A person skilled in the art should recognize that the resistors R2 and R1 might be made of a variety of materials including non-salicide polysilicon.

The replication resistance 16 is implicitly known by so establishing a reference current $I_{REF}$ through and a reference voltage $V_{REF1}$ across the replication resistance 16. Amplifier A2, resistors R1 and R2, and transistor M1 generate the reference voltage $V_{REF1}$ responsive to the bandgap voltage $V_{BG}$. The action of the feedback circuit 18 is to ensure that the reference voltage $V_{REF}$ is maintained substantially constant across the replication resistance 16. Amplifier A1, reference resistor $R_{REF}$, transistor M2 generate the reference current $I_{REF}$ responsive to the bandgap voltage $V_{BG}$.

The OTA compares the voltage across the replication resistance 16 to the reference voltage $V_{REF1}$ and acts to drive the voltage across the replication resistance 16 to the reference voltage $V_{REF1}$. For example, if the voltage at the second end of the replication resistor RR1 is lower than the reference voltage $V_{REF1}$, the OTA sinks current from the capacitor C1 causing the voltage at the gate of transistor MR1 to decrease. This gate voltage decrease increases the enhancement of the transistor MR1, in turn, increasing the voltage at the second end of the replication resistor RR1.

The value of the replication resistance 16 is found from application of Ohm's Law:

Replication Resistance = $V_{ACROSS\ REPLICATION\ RESISTANCE}$ /

$I_{THROUGH\ REPLICATION\ RESISTANCE}$

= $(((R2/R1)*Vbg)/(Vbg/R_{REF}))$

= $(R2/R1)*R_{REF}$

Thus, the replication resistance 16, and the termination resistance 14 by association, is dependent on the ratio of resistors R2 and R1 and on the external reference resistor $R_{REF}$. As mentioned above, the ratio of R2 and R1 is precisely controlled on the display device controller (not shown). The reference resistor Rref is preferably chosen as an inexpensive precision (e.g., 1 percent or better) metal film resistor. Importantly, the replication resistance 16 is not dependent on the bandgap voltage $V_{BG}$. Thus, any convenient reference voltage can be used regardless of whether its magnitude is precisely controlled.

The termination resistance 14 can be similarly precisely controlled provided that the same gate bias is applied to the termination transistors MR2 and MR3 as is applied to the replication transistor MR1 and provided that the termination transistors MR2 and MR3 are built using the same processes as the replication transistor MR1 on the same monolithic integrated circuit such as the display device controller mentioned above. The termination transistors MR2 and MR3 receive a gate bias from the feedback circuit 18, including the replication transistor MR1. In the preferred embodiment of the present invention, the replication transistors MR2 and MR3 are built by connecting N number of devices identical to the replication transistor MR1 in parallel. This results in a drain/source resistance of the termination transistors MR2 and MR3 that is 1/N times that of the replication transistor MR1.

Similarly, resistors TR2 and TR3 are made by paralleling N number of resistors identical to the replication resistor RR1 resulting in a resistance equal to RR1/N. That is, the value of resistor TR2 is RR1/N and the value of resistor TR3 is RR1/N. Thus, the termination resistance 14 is 1/N times that of the replication resistance 16. By so scaling the termination resistance 14, the replication resistance 16 can operate at a higher resistance and a consequent lower current, resulting in an overall power savings.

For example, the DVI standard requires that the termination resistances 14A and 14B be connected to corresponding transmission lines RX+ and RX− on a first end and to a power supply $V_{DD}$ on a second end, the power supply $V_{DD}$ being nominally equal to +3.3 V. The DVI further requires that the termination resistances 14A and 14B are equal to 50 Ω. In the preferred embodiment, the termination resistors TR2 and TR3 are non-salicide polysilicon resistors having excellent linearity at the expense of a large tolerance. The value of each of resistors TR2 and TR3 is selected such that each can never exceed the desired 50 Ω resistance. Let resistors TR2 and TR3 have a nominal value of 37.5 Ω. Assuming a 15% tolerance, the range of values for resistors TR2 and TR3 is 31.9 to 43.1 Ω. Thus, transistors MR2 and MR3 must take on a possible range of resistance values from about 6.9 to 18.1 Ω. The size of transistors MR2 and MR3 is selected such that this range of drain/source resistance is achieved when the transistors MR2 and MR3 operate in the triode region. Assuming N is 10, the replication resistance 16 is 10 times that of the termination resistances 14A or 14B. Therefore, the replication resistance equals 500 Ω. The value of the replication resistor RR1 can be selected in similar fashion to that described above in relation to termination resistors TR2 and TR3.

Figure 4:
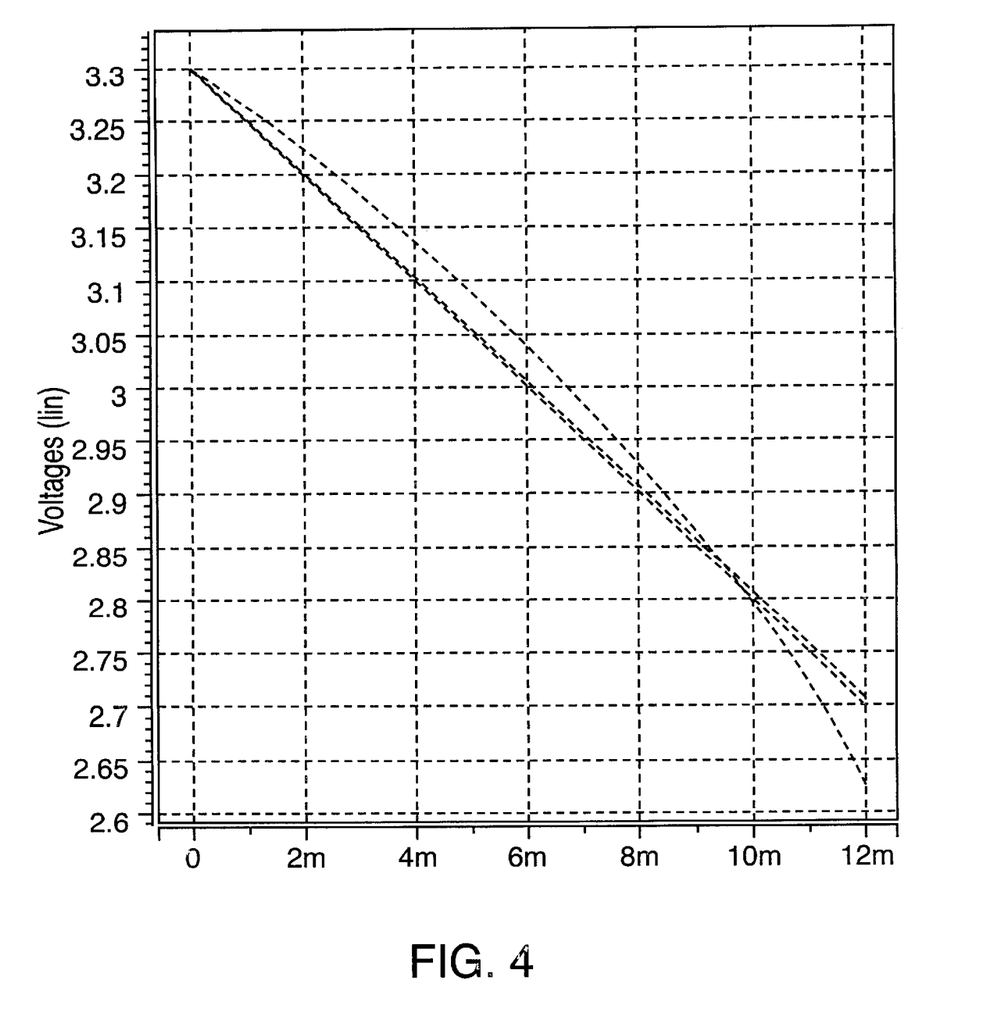
FIG. 4 is a graph of output characteristic curves comparing the termination resistance of the termination circuit of the present invention with a termination resistance comprising a single MOSFET transistor operating in the triode region and with a termination resistance comprising an ideal resistor.

FIG. 4 is a graph of output characteristic curves comparing the termination resistance of the present invention with a termination resistance comprising a single MOSFET transistor operating in the triode region and with a termination resistance comprising an ideal resistor. The termination resistance comprising a MOSFET transistor is shown as the topmost curve. As shown, the MOSFET exhibits a nonlinear performance over the range of currents indicated with a significant nonlinearity at currents greater than 10 mA. The MOSFET transistor matches the present invention and the ideal resistor in large signal resistance at slightly below 10 mA. In contrast, the present invention substantially tracks the performance of the ideal resistor over the broad range of currents indicated. The ideal resistor is represented by the lower most curve on the graph. The performance of the termination circuit of the present invention is represented by the middle of the three curves shown in FIG. 4.

Figure 5:
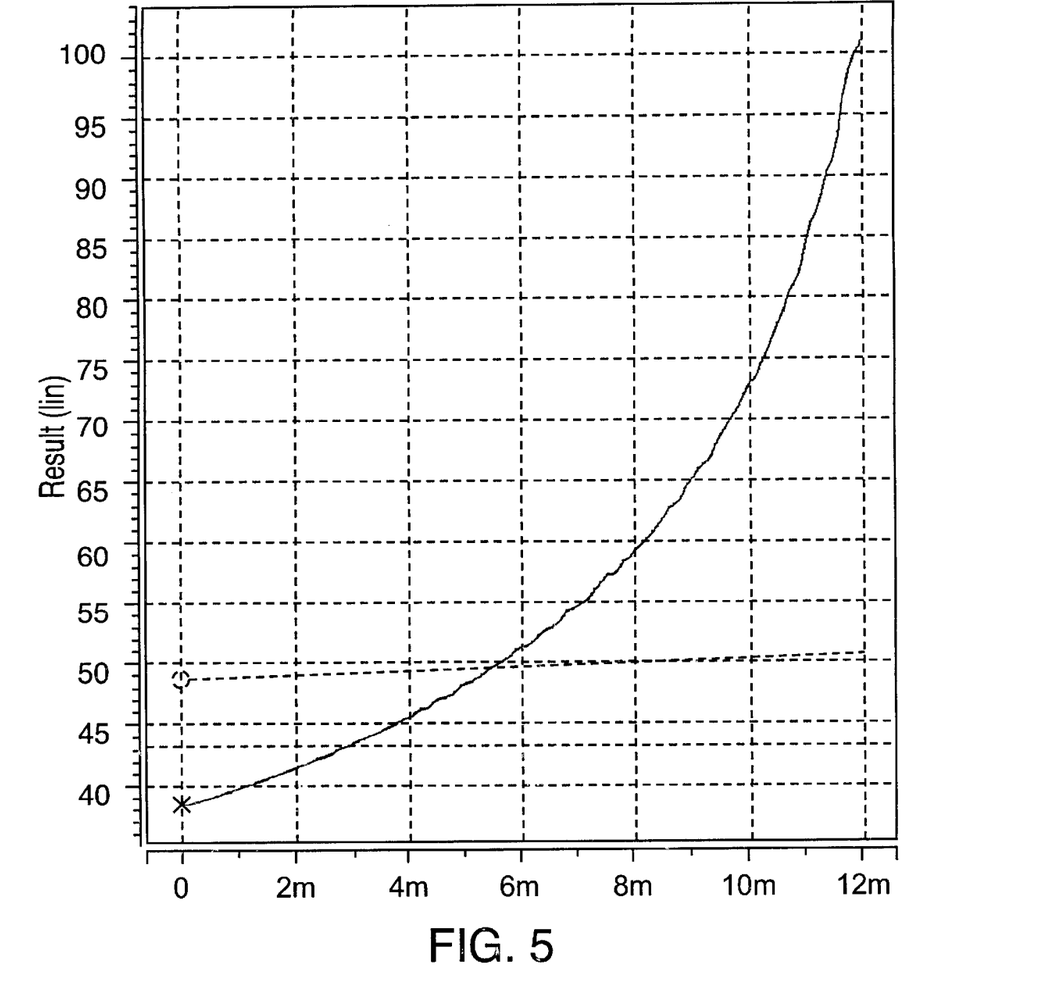
FIG. 5 is graph of the differential resistance of the termination circuit of the present invention, the differential resistance of a MOSFET transistor operating in the triode region, and the differential resistance of an ideal resistor.

FIG. 5 highlights the nonlinear operation of the termination resistance comprising a single MOSFET transistor by showing the curved differential resistance of the MOSFET transistor (line X). In contrast, the differential resistance of the present invention is fairly flat (line O). The differential resistance of an ideal 50 Ω resistor is 50 Ω. The present invention maintains a differential resistance very close to 50 Ω over the 0–12 mA range. The MOSFET transistor operating in the triode region varies from less than 40 Ω to over 100 Ω over the same range, a clearly unsuitable termination resistance where 5–10 percent tolerances are required.

Figure 6:
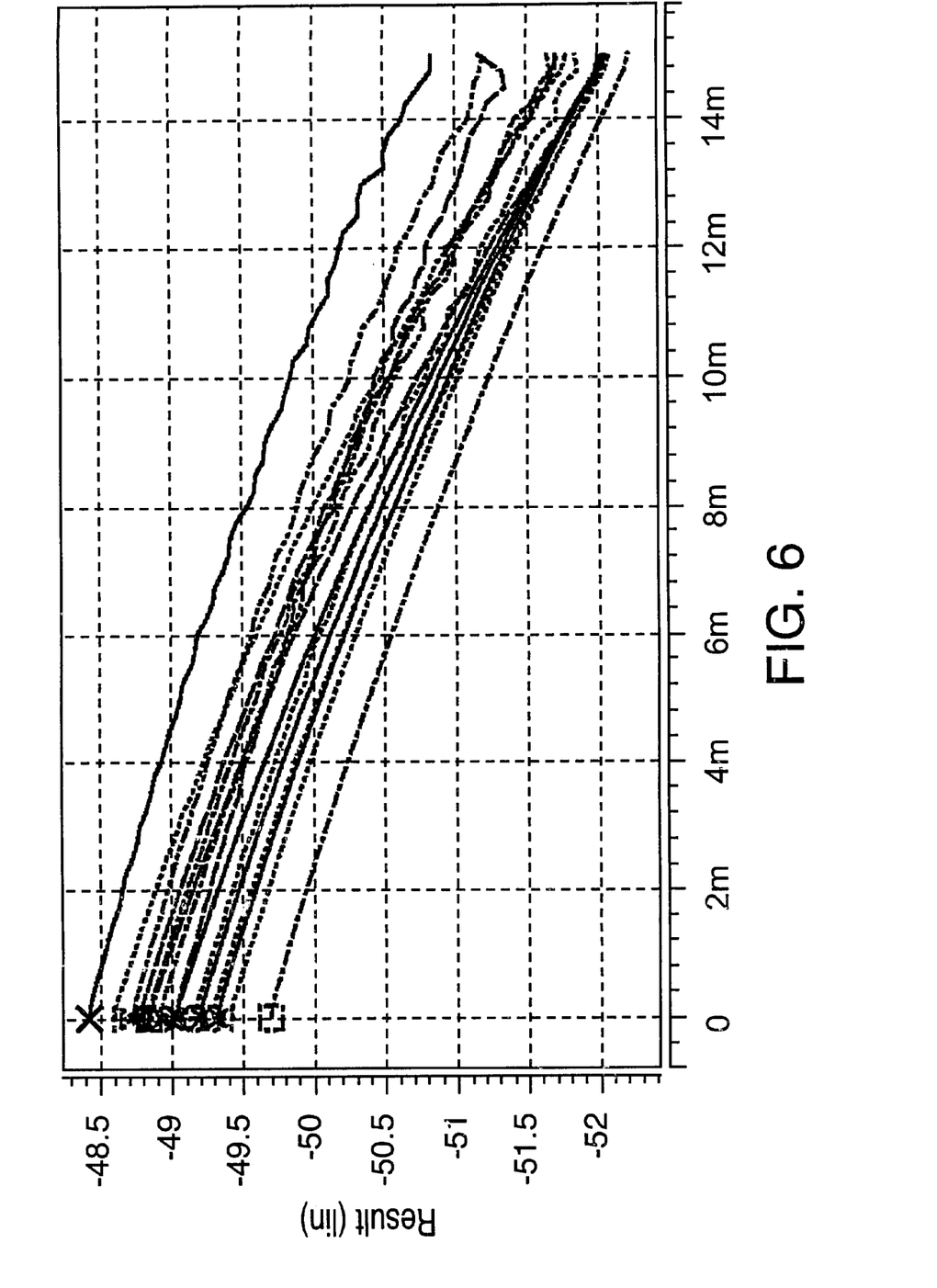
FIG. 6 is a graph of termination resistance variations over worst-case process and temperature extremes for the termination circuit of the present invention.

FIG. 6 is a graph of variations in termination resistance of the present invention over worst-case process and temperature extremes. Each of the curves shown in FIG. 6 shows the differential termination resistance of the present invention versus current at a different process corner. The temperatures shown are 0, 62.5, and 125 degrees and the five process corners shown are TT (typical N and P processes), FF (fast N and P processes), SS (slow N and P processes), FS (fast N and slow P processes), and SF (slow N and fast P processes). As is shown in FIG. 6, the differential termination resistance of the present invention remains within acceptable tolerances at all extremes.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. An on-chip termination circuit, comprising:
 a first termination resistance including a first gate and a first input terminal, the first input terminal being adapted to receive a first twisted pair transmission signal;
 a second termination resistance including a second gate and a second input terminal, the second input terminal being adapted to receive a second twisted pair transmission signal,
  wherein each of the first and second termination resistances of the on-chip termination circuit comprise a termination resistor connected serially between the first input terminal and a termination transistor;
 a replication resistance coupled to the first and second termination resistances and adapted to replicate the first and second termination resistances, the replication resistance including a replication gate commonly connected to the first and second gates; and
 a feedback circuit adapted to maintain substantially constant a first reference voltage across the replication resistance.

2. The on-chip termination circuit of claim 1 wherein the feedback circuit comprises an operational transconductance amplifier.

3. The on-chip termination circuit of claim 2 wherein the replication resistance comprises a replication MOSFET serially connected to a replication resistor.

4. The on-chip termination circuit of claim 3 wherein the termination MOSFET is a predetermined number of replication MOSFETs connected in parallel.

5. The on-chip termination circuit of claim 4 wherein the termination MOSFET includes a drain-source resistance that is the inverse of the predetermined number of replication MOSFETs times a drain-source resistance of the replication MOSFET and wherein the termination resistor includes resistance that is the inverse of the predetermined number of replication MOSFETs times a resistance the replication resistor.

6. The on-chip termination circuit of claim 1 including a reference voltage generating circuit adapted to generate the first reference voltage and a first reference current.

7. The on-chip termination circuit of claim 6 wherein the reference voltage generating circuit comprises:
 a bandgap reference voltage generator adapted to generate a bandgap voltage;
 a reference circuit coupled to the bandgap reference voltage and adapted to generate a second reference current and a second reference voltage; and
 a reference resistor coupled to the reference circuit and adapted to generate the first and the second reference currents according to the bandgap voltage.

8. An on-chip termination circuit, comprising:
 a termination resistance;
 a replication resistance coupled to the termination resistance and adapted to replicate the termination resistance;
 a feedback circuit adapted to maintain substantially constant a reference voltage across the replication resistance; and
 a reference voltage generating circuit adapted to generate the first reference voltage and a first reference current;
  wherein the reference voltage generating circuit comprises:
   a bandgap reference voltage generator adapted to generate a bandgap voltage;
   a reference circuit coupled to the bandgap reference voltage and adapted to generate a second reference current and a second reference voltage; and
   a reference resistor coupled to the reference circuit and adapted to generate the first and the second reference currents according to the bandgap voltage;
  wherein the reference circuit comprises:
   a first and second amplifiers adapted to receive the bandgap voltage;
   a first transistor having a gate connected to an output of the first amplifier and a source connected to a first end of the reference resistor;
   a second transistor having a gate connected to an output of the second amplifier;
   a first resistor having a first end connected to ground and a second end connected to a source of the second transistor;
   a second resistor having a first end connected to a drain of the second transistor and a second end connected to a power supply; and
   wherein the second amplifier is adapted to generate the reference voltage across the second resistor, the reference voltage being proportional to the ratio of the first and second resistors.

9. The on-chip termination circuit of claim 8 wherein the feedback circuit comprises:
 an operational transconductance amplifier adapted to maintain constant the reference voltage; and
 a capacitor connected to an output terminal of the operational transconductance amplifier.

10. The on-chip termination circuit of claim 9 wherein the replication resistance is proportional to a ratio of the first and second resistors.

11. A termination circuit integrated into a semiconductor device, comprising:
 termination resistance means adapted to provide a termination resistance to a transmission line and including first and second input terminals, the first and second input terminals being adapted to receive first and second transmission signals, respectively, wherein the termination resistance means of the termination circuit comprises at least one termination transistor having a gate, drain, and source,
and at least one termination resistor having a first end connected to the source of the at least one termination transistor,
and a second end connected to at least one of said first and second input terminals;

replication resistance means adapted to replicate the termination resistance, the replication resistance means including a replication terminal commonly connected to the first and second input terminals;

feedback means adapted to maintain constant a reference voltage across the replication resistance; and reference voltage generating means adapted to generate the reference voltage.

12. The termination circuit of claim 11 wherein the replication resistance comprises:

a replication MOSFET having a gate, drain, and source, the gate of the replication MOSFET being connected to the gate of the at least one termination MOSFET; and a replication resistor having a first end connected to the source of the replication MOSFET.

13. The termination circuit of claim 12 wherein the termination resistor is a scale factor smaller than the replication resistor.

14. The termination circuit of claim 11 wherein the reference voltage generating means comprises:

a voltage generating means adapted to generate a bandgap voltage;

a circuit means adapted to generate the reference voltage and a reference current responsive to the bandgap voltage; and a reference resistor means coupled to the circuit means and adapted to receive the bandgap voltage.

15. A termination circuit integrated into a semiconductor device, comprising:

termination resistance means for providing a termination resistance to a transmission line, wherein the termination resistance means of the termination circuit includes at least one termination resistor connected serially between the transmission line and at least one termination transistor;

replication resistance means for replicating the termination resistance;

feedback means adapted to maintain constant a reference voltage across the replication resistance; and reference voltage generating means adapted to generate the reference voltage;
wherein the feedback means comprises:
an operational transconductance amplifier; and
a capacitor coupled to an output of the operational transconductance amplifier.

16. A termination circuit integrated into a semiconductor device, comprising:

termination resistance means for providing a termination resistance to a transmission line;

replication resistance means for replicating the termination resistance;

feedback means adapted to maintain constant a reference voltage across the replication resistance; and reference voltage generating means adapted to generate the reference voltage;
wherein the reference generating means comprises:

a voltage generating means adapted to generate a bandgap voltage;

a circuit means adapted to generate the reference voltage and a reference current responsive to the bandgap voltage; and a reference resistor means coupled to the circuit means and adapted to receive the bandgap voltage;
wherein the circuit means comprises:

a first and second amplifier means adapted to receive the bandgap voltage;

a first transistor means having a gate connected to an output of the first amplifier means and a source connected to a first end of the reference resistor means;

a second transistor means having a gate connected to an output of the second amplifier means;

a first resistor means having a first end connected to ground and a second end connected to a source of the second transistor means;

a second resistor means having a first end connected to a drain of the second transistor means and a second end connected to a power supply means;

wherein the second amplifier means is adapted to generate a second reference voltage across the second resistor means, the reference voltage being proportional to a ratio of the first and second resistor means.

17. The termination circuit of claim 16 wherein the replication resistance means is proportional to the ratio of the first and second resistor means.

18. An on-chip method for terminating a twisted pair transmission line, comprising:

receiving a pair of differential signals from the twisted pair transmission line at a corresponding pair of termination resistances, wherein each of the pair of termination resistances includes a termination resistor connected serially between one of the twisted pair transmission line and a termination transistor;

replicating the pair of termination resistances using a replication resistance;

commonly providing a first reference voltage to the pair of termination resistances and the replication resistance; and maintaining substantially constant the first reference voltage across the replication and the pair of termination resistances using a feedback circuit.

19. The on-chip method for terminating the transmission line of claim 18 including generating a reference current through the replication resistance using a reference voltage generating circuit.

20. The on-chip method for terminating the transmission line of claim 19 wherein the voltage generating circuit comprises:

an off-chip resistor;

an amplifier circuit; and a bandgap voltage generator coupled to the off-chip resistor through the amplifier circuit.

21. The on-chip method for terminating the transmission line of claim 18 wherein commonly providing a second reference voltage includes generating a reference voltage that is proportional to a ratio of a first and second on-chip resistors.

22. The on-chip method for terminating the transmission line of claim 18 including driving the pair of termination resistances with the reference voltage across the replication resistance.

23. The on-chip method for terminating the transmission line of claim 18 wherein replicating the pair of termination includes connecting the replication resistance in parallel to the pair of termination resistances.

24. The on-chip method for terminating the transmission line of claim 18 wherein replicating the pair of termination resistances comprises:

serially connecting a replication MOSFET and a replication resistor; and connecting a gate of the termination MOSFET to a gate of the replication MOSFET.

* * * * *

UNITED STATES PATENT AND TRADEMARK OFFICE
CERTIFICATE OF CORRECTION

PATENT NO.    : 6,414,512 B1
DATED         : July 2, 2002
INVENTOR(S)   : Moyer

It is certified that error appears in the above-identified patent and that said Letters Patent is hereby corrected as shown below:

Column 5,
Line 44, "predeceder" should read -- predecoder --.

Column 6,
Line 53, "when said signal the" should read -- when the said signal --;

Signed and Sealed this

Fourth Day of February, 2003

JAMES E. ROGAN
*Director of the United States Patent and Trademark Office*